United States Patent
Holbrook et al.

(10) Patent No.: US 6,472,326 B1
(45) Date of Patent: Oct. 29, 2002

(54) RELIABLE PARTICLE REMOVAL FOLLOWING A PROCESS CHAMBER WET CLEAN

(75) Inventors: Allison Holbrook, San Jose; Greg A. Johnson, Sunnyvale; Darlene Smith; Omar Serna, both of San Jose; Theodros W. Mariam, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 5 days.

(21) Appl. No.: 09/678,421

(22) Filed: Oct. 2, 2000

(51) Int. Cl.[7] ............................................. H01L 21/302
(52) U.S. Cl. ...................... 438/704; 438/690; 438/905; 118/719; 118/629
(58) Field of Search .................. 438/905, 704, 438/745, 690, 691, 693, 706, 748, 906, 935, 734; 118/719, 722, 629, 631, 62, 70, 300, 302

(56) References Cited

U.S. PATENT DOCUMENTS

| | | | |
|---|---|---|---|
| 4,800,105 A | * | 1/1989 | Nakayama et al. .......... 427/253 |
| 6,090,222 A | * | 7/2000 | Ivey et al. ....................... 134/21 |
| 6,110,556 A | * | 8/2000 | Bang et al. ................. 428/64.1 |
| 2001/0052350 A1 | * | 12/2001 | Chow et al. ................. 134/1.1 |

* cited by examiner

Primary Examiner—Caridad Everhart
(74) Attorney, Agent, or Firm—Sawyer Law Group LLP

(57) ABSTRACT

Aspects for more reliable particle removal from a semiconductor processing chamber following a chamber wet clean are described. With the present invention, an improved particle removal following wet cleans of semiconductor processing chambers occurs. The present invention creates a turbulent gas flow in a chamber in order to more thoroughly remove particles from the chamber, including those that the wet clean procedures cannot reach. In a straightforward and efficient manner, the turbulent gas flow is created by providing gas in both an upper and lower portion of the chamber substantially simultaneously, including the advantageous use of the backside helium available to chamber processing.

17 Claims, 2 Drawing Sheets

RELIABLE PARTICLE REMOVAL FOLLOWING A PROCESS CHAMBER WET CLEAN

FIELD OF THE INVENTION

The present invention relates to semiconductor process chambers, and more particularly to particle removal following a process chamber wet clean.

BACKGROUND OF THE INVENTION

Defect-free processing is paramount in semiconductor processing. Semiconductor processing tools must be free of defects/particles so that product yields are not impacted. Processing tools require cleaning, so that defect-free processing can be maintained. FIGS. 1a and 1b illustrate a prior art chamber cleaning process. Referring concurrently to both FIGS. 1a and 1b, a process chamber 10 is cleaned and wiped with a solvent (step 11) and then placed under vacuum (step 13). The disturbance of the solvent clean step can leave particles 12 inside the chamber 10 in areas, such as area 14, which are not accessible from the solvent wipe. Then, typically, a function known as cycle purge is performed on the chamber (step 15). A cycle purge creates a laminar flow through the chamber 10 by allowing a small amount of inert gas 16 through a single, cycle purge port 18 in the chamber 10 until a preset chamber pressure is achieved. The laminar flow is then turned off, and the chamber 10 is pumped down via pump 20 through open valve 22 to base pressure. This action of flowing gas and pumping down is repeated several times as a part of the cycle purge. Since the common method of cycle purging following solvent wipe does not always yield a particle free chamber, a better and more reliable method is needed so that manufacturing cost can be minimized.

The present invention addresses such a need.

SUMMARY OF THE INVENTION

The present invention provides aspects for more reliable particle removal from a semiconductor processing chamber following a chamber wet clean. With the present invention, an improved particle removal following wet cleans of semiconductor processing chambers occurs. The present invention creates a turbulent gas flow in a chamber in order to more thoroughly remove particles from the chamber, including those that the wet clean procedures cannot reach. In a straightforward and efficient manner, the turbulent gas flow is created by providing gas in both an upper and lower portion of the chamber substantially simultaneously, including the advantageous use of the backside helium available to chamber processing.

These and other advantages of the aspects of the present invention will be more fully understood in conjunction with the following detailed description and accompanying drawings.

DETAILED DESCRIPTION OF THE INVENTION

The present invention relates to particle removal from process chambers following a wet clean. The following description is presented to enable one of ordinary skill in the art to make and use the invention and is provided in the context of a patent application and its requirements. Thus, the present invention is not intended to be limited to the embodiment shown, but is to be accorded the widest scope consistent with the principles and features described herein.

In the present invention, an approach for particle removal that utilizes a turbulent gas flow following a tool wet clean is presented. With the turbulent gas flow approach in conjunction with cycle purging, a more reliable and particle-free chamber results after a chamber wet clean.

Figure 1A:
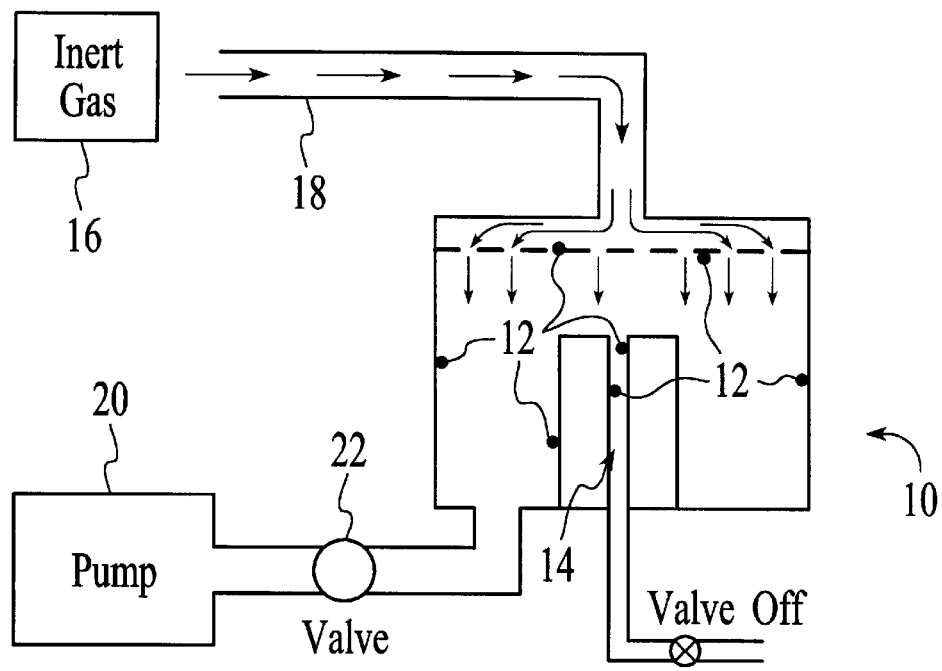
FIGS. 1a and 1b illustrate a prior art chamber cleaning process.
Figure 2A:
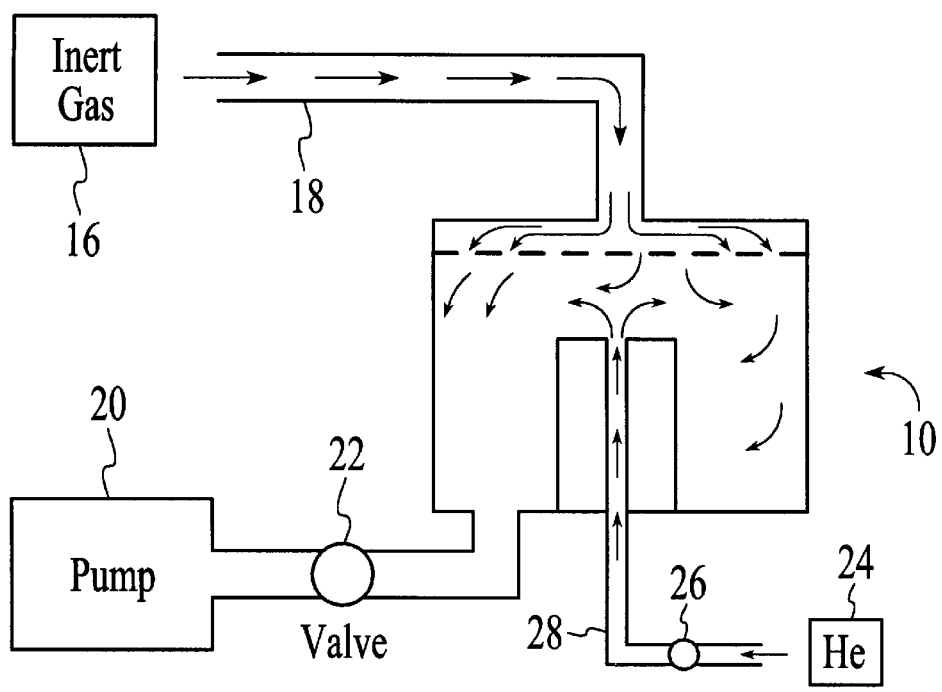
FIGS. 2a and 2b illustrate a chamber cleaning process in accordance with the present invention.
Figure 1B:
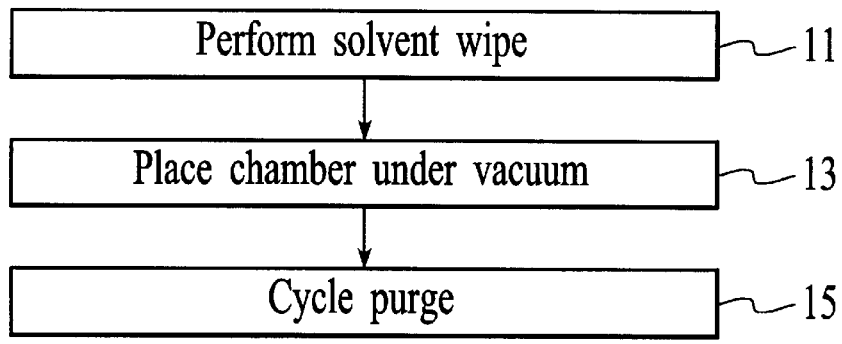
Figure 2B:
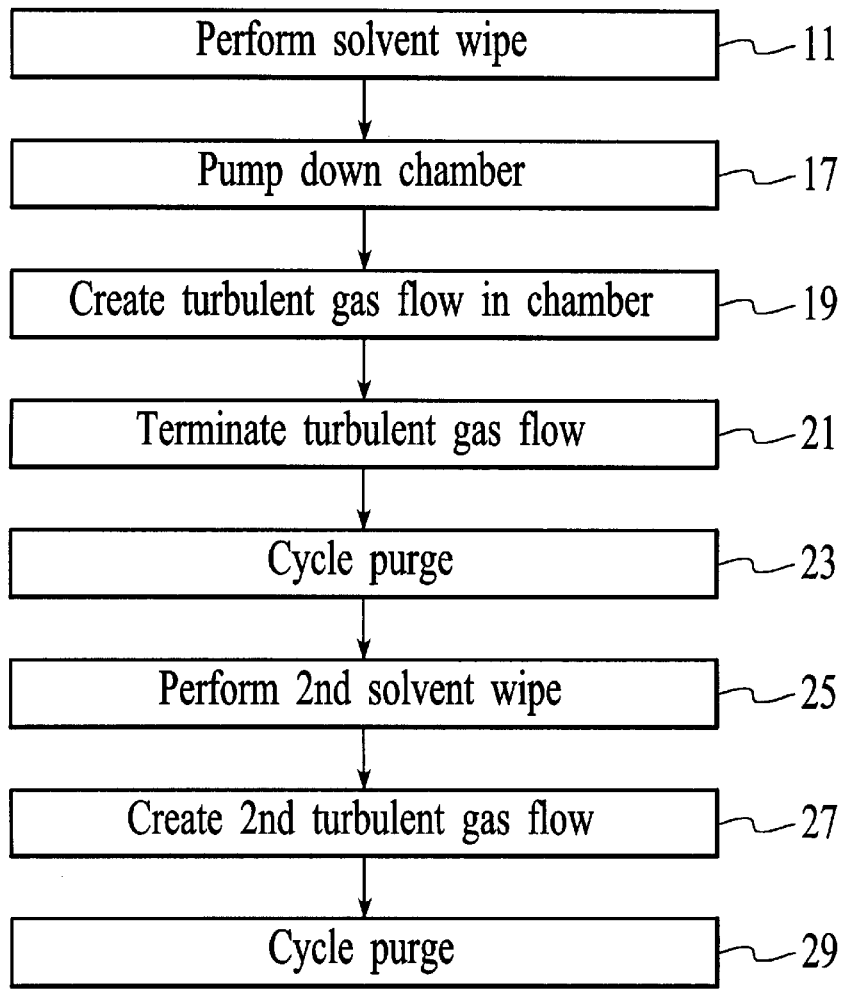

Referring now concurrently to FIGS. 2a and 2b, a preferred embodiment for chamber cleaning is presented. The features of the chamber 10 and chamber cleaning that correspond with those of the prior art description of FIGS. 1a and 1b have been numbered similarly. Thus, the chamber cleaning process initiates with performance of a solvent wipe of the chamber 10 in areas which are accessible to remove particles that might remain on the chamber and chamber part surfaces (step 11). The chamber 10 is closed and pumped down to base pressure via pump 20 through open valve 22 (step 17). A turbulent gas flow is then created (step 19). The turbulent gas flow preferably is created by flowing a first gas, i.e., inert gas 16 such as Nitrogen or Argon at about 100–500 sccm, into an upper portion of the chamber 10 through an upper port, i.e., the single port 18 normally used as the cycle purge port, and substantially simultaneously, flowing a second gas, i.e., helium gas 24 at flows of about 50–500 sccm, into a lower portion of the chamber 10 through an open valve 26 in a lower port 28. The present invention takes to advantage the presence of the lower port 28 and its normal use to supply backside helium to cool wafers during wafer processing by utilizing it to flow gas from the lower portion of the chamber 10. In this manner, the turbulent gas flow is created by the inserted helium from the lower portion with the inert gases from the upper portion of the chamber 10. The turbulent gas flow in the chamber 10 purges out the particles which were inaccessible or which were missed during the solvent wipe.

The turbulent gas flow is utilized for a chosen time period, e.g., about 5–20 min. The turbulent gas flow is then ended (step 21), i.e., the inert gas 16 and helium gas 24 are turned off. A cycle purge routine is then performed (step 23). The chamber 10 is then reopened and a second solvent wipe is performed on the chamber (step 25). After closing the chamber 10, a second turbulent gas flow is created (step 27), i.e., backside helium and inert gases are flowed as in step 19. This is followed by another cycle purge (step 29). Upon the completion of the desired number of cycle purges, the particle removal process is complete. Once verification of a particle-free chamber is made, the chamber can be utilized for desired semiconductor processing to commence.

With the present invention, an improved method is provided for particle removal following wet cleans of semiconductor processing chambers. The present invention creates a turbulent gas flow in a chamber in order to more thoroughly remove particles from the chamber, including those that the wet clean procedures cannot reach. In a straightforward and efficient manner, the turbulent gas flow is created by providing gas in both an upper and lower portion of the chamber substantially simultaneously, including advantageous use of the backside helium available to chamber processing.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for more reliable particle removal from a semiconductor processing chamber following a chamber wet clean, the method comprising:

(a) creating a turbulent gas flow in a processing chamber that has been wet cleaned by flowing gas from a first gas source in an upper portion of the processing chamber and substantially simultaneously flowing gas from a second gas source in a lower portion of the processing chamber; and (b) performing a cycle purge routine after termination of the turbulent gas flow.

2. The method of claim 1 wherein the first gas source further comprises an inert gas source.

3. The method of claim 1 wherein the second gas source further comprises a backside helium gas source.

4. The method of claim 1 further comprising (c) performing a solvent wipe after the cycle purge routine.

5. The method of claim 4 further comprising (d) creating a turbulent gas flow a second time in the processing chamber after the solvent wipe.

6. The method of claim 5 further comprising (e) performing another cycle purge.

7. A system with more reliable particle removal in a semiconductor processing environment, the system comprising:

a processing chamber including a first port in an upper portion and second port in a lower portion; and at least two gas sources, a first gas source coupled to the first port and a second gas source coupled to the second port, the at least two gas sources creating a turbulent flow in the processing chamber following a chamber wet clean by substantially simultaneously flowing gases into the chamber through the first port and the second port.

8. The system of claim 7 wherein the first gas source comprises an inert gas source.

9. The system of claim 7 wherein the second gas source comprises a helium gas source.

10. The system of claim 9 wherein the helium gas source further comprises a backside helium gas source.

11. The system of claim 7 further comprising a pump coupled to the processing chamber for pumping gases from the processing chamber, including during cycle purges following the turbulent flow.

12. A method for more reliable particle removal form semiconductor processing chambers following chamber wet cleans, the method comprising:

(a) performing a solvent wipe of a processing chamber;

(b) utilizing a upper port of the processing chamber and a lower port of the processing chamber substantially simultaneously to insert gases and create a turbulent gas flow in the processing chamber; and (c) utilizing the upper port for a cycle purge routine upon completion of the turbulent gas flow.

13. The method of claim 12 wherein step (b) further comprises (b1) utilizing a backside helium port to supply helium into a lower portion of the processing chamber.

14. The method of claim 13 wherein step (b) further comprises (b2) utilizing a cycle purge port to supply inert gases into an upper portion of the processing chamber.

15. The method of claim 12 further comprising (d) performing another solvent wipe of the processing chamber.

16. The method of claim 15 further comprising (e) repeating step (b).

17. The method of claim 16 further comprising (f) performing another cycle purge routine.

* * * * *